United States Patent
Chang

(10) Patent No.: US 7,009,245 B2
(45) Date of Patent: Mar. 7, 2006

(54) HIGH-K TUNNELING DIELECTRIC FOR READ ONLY MEMORY DEVICE AND FABRICATION METHOD THEREOF

(75) Inventor: Kent Kuohua Chang, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/711,004

(22) Filed: Aug. 17, 2004

(65) Prior Publication Data

US 2004/0262672 A1 Dec. 30, 2004

Related U.S. Application Data

(62) Division of application No. 10/248,179, filed on Dec. 24, 2002, now Pat. No. 6,797,567.

(51) Int. Cl.
*H01L 29/788* (2006.01)
(52) U.S. Cl. ............... 257/321; 257/310; 257/314; 257/315; 257/316; 257/324
(58) Field of Classification Search ............... 257/321, 257/324, 316, 315, 314, 310; 438/266
See application file for complete search history.

(56) References Cited

U.S. PATENT DOCUMENTS 5,349,221 A * 9/1994 Shimoji ............ 257/324
6,468,865 B1 * 10/2002 Yang et al. .......... 438/262

OTHER PUBLICATIONS

Kang et al. "Improved Thermal Stability and device performance of ultra-thin (EOT<10A) gate dielectric MOSFETs by using hafnium oxynitride (HfOxNy)"; Jun. 2002; IEEE, pp. 146-147.*
Laaksonen et al. "Advanced CMOS transistors with a novel NfSiON gate dielectric", Jun. 2002, IEEE, pp. 148-149.*
Rotondaro et al. "Carrier mobility in MOSFETs fabricated with Hf-Si-O-N gate dielectric, polysilicon gate electrode, and self-aligned source and drain"; Oct. 2002, pp. 603-605.*
Shanware et al. "Reliability evaluation of HfSiON gate dielectric film with 12.8 a SiO2 equivalent thickness"; Dec. 2001.*

* cited by examiner

*Primary Examiner*—Maria F. Guerrero
(74) *Attorney, Agent, or Firm*—Jianq Chyun IP Office

(57) ABSTRACT

A fabrication method for a read only memory device with a high dielectric constant tunneling dielectric layer, wherein this method provides forming a tunneling dielectric layer on a substrate, wherein the tunneling dielectric layer is formed with HfSiON or $HfO_xN_y$. An electron trapping layer and a top oxide layer are sequentially formed over the tunneling dielectric layer. Thereafter, the oxide layer, the electron trapping layer and the tunneling dielectric layer are patterned to form a plurality of stacked structures, followed by forming doped regions in the substrate between the stacked structures. Buried drain oxide layers are further formed over the surface of the doped regions, followed by forming a patterned conductive layer as the word line for the read only memory device.

9 Claims, 2 Drawing Sheets

HIGH-K TUNNELING DIELECTRIC FOR READ ONLY MEMORY DEVICE AND FABRICATION METHOD THEREOF

CROSS REFERENCE TO RELATED APPLICATIONS

This application is a divisional of a prior application Ser. No. 10/248,179, filed Dec. 24, 2002, now U.S. Pat. No. 6,797,567.

BACKGROUND OF INVENTION

1. Field of Invention

The present invention relates to a structure of an integrated circuit (IC) and a fabrication method thereof. More particularly, the present invention relates to a read only memory device that comprises a high dielectric constant (high-K) tunneling dielectric layer and a fabrication method thereof.

2. Description of Related Art

With the advances in miniature processing technology in a semiconductor manufacturing process, the miniaturization of a device dimension provides an increase of integration of semiconductor device, an enhancement of the function of integrated circuit, a lowering of cost, an improvement of the devices replacement rate and a lowering of the devices consumption rate. Accompany with the reduction of the dimension of a semiconductor device, the thickness of the dielectric layer (oxide layer) between the gate and the substrate needs to become thinner in order to maintain the capacitance between the gate and the channel.

For a programmable and erasable read only memory device, silicon dioxide formed by thermal oxidation is typically used to form the tunnel oxide layer. Therefore, as the device dimension for a read only memory device continues to reduce, the thickness for the tunnel oxide layer must become thinner accordingly. However, the tunnel oxide layer comprises a low limit in thickness. In other words, the tunnel oxide layer must comprise a certain thickness. When the thickness of the tunnel oxide layer is below the lower limit, many problems will surface. For example, during a subsequent thermal process, a thin tunnel oxide layer cannot prevent oxygen or dopants to diffuse into the substrate or to be trapped in the tunnel oxide layer, thereby changing the device's threshold voltage. Further, when the thickness of the tunnel oxide layer is smaller than the lower limit, the retention property of the tunnel oxide layer will become inferior. Consequently, the electrons that are stored in the charge trapping layer will flow into the substrate through the tunnel oxide layer. Losing the stored information and generation of current leakage are thereby resulted. Therefore, as indicated in the above, limited by the thickness of the tunnel oxide layer, the read only memory device dimension cannot be reduced further.

SUMMARY OF INVENTION

Accordingly, the present invention provides a read only memory device with a high-K tunneling dielectric layer and a fabrication method thereof, wherein oxygen or dopants being diffused into the substrate or trapped in the tunneling dielectric layer to adversely affect the threshold voltage is prevented.

The present invention also provides a read only memory device with a high-K tunneling dielectric layer and a fabrication method thereof, wherein the electrons that are stored in the charge trapping layer is prevented from leaking into the substrate. As a result, loss of the stored information and current leakage are prevented.

The present invention also provides a read only memory device that comprises a high-K tunneling dielectric layer and a fabrication method thereof, wherein oxidation reaction to generate silicon dioxide at the interface between the tunneling dielectric layer and the substrate or between the tunneling dielectric layer and the electron trapping layer is prevented.

The present invention further provides a read only memory device with a high-K tunneling dielectric layer and a fabrication method thereof, wherein the tunneling dielectric layer comprises a lower interfacial trap density to prevent oxygen, dopants or electrons being trapped at interface between the tunneling dielectric layer and the electron trapping layer or between the tunneling dielectric layer and the substrate.

The present invention also provides a read only memory device with a high-K tunneling dielectric layer and a fabrication method thereof, wherein the fabrication method is compatible with the present manufacturing process.

The present invention further provides a read only memory device that comprises a high-K tunneling dielectric layer and a fabrication method thereof, wherein a lower operating voltage can use to operate the device.

The present invention further provides a read only memory device that comprises a high-K tunneling dielectric layer and a fabrication method thereof, wherein the read only memory device can be further reduced in dimension.

The present invention provides a fabrication method for a read only memory device that comprises a high-K tunneling dielectric layer, wherein the tunneling dielectric layer is formed over the substrate. A material for forming the tunneling dielectric layer is selected from the group consisting of hafnium oxynitride ($H_fO_xN_y$) and hafnium silicon oxynitride ($H_fSiON$). Thereafter, an electron trapping layer and a top oxide layer are sequentially formed over the tunneling dielectric layer. The top oxide layer, the electron trapping layer and the tunneling dielectric layer are then patterned to form a plurality of stacked structures. A doped region is then formed in the substrate between the stacked structures. Thereafter, a buried drain oxide layer is formed over the surface of the doped region, followed by forming a patterned conductive layer over the substrate as the word line of the read-only memory device.

The present invention provides a read only memory device with a high-K tunneling dielectric layer, wherein the read only memory device comprises at least a substrate, a tunneling dielectric layer, an electron trapping layer, a top oxide layer, a conductive layer and a buried drain region. The tunneling dielectric layer is disposed over the substrate and this tunneling dielectric layer is formed with a material selected from the group consisting of ($H_fO_xN_y$) and ($H_fSiON$). The electron trapping layer is disposed over the tunneling dielectric layer, and the top oxide layer is positioned over the electron trapping layer, wherein the tunneling dielectric layer, the electron trapping layer and the top oxide layer form a stacked structure. The conductive layer is disposed at least over the top oxide layer, and the buried drain region is configured in the substrate beside both sides of the stacked structure.

Accordingly, the present invention replaces the conventional silicon oxide with ($H_fO_xN_y$) or ($H_fSiON$) as the tunneling dielectric layer of the read only memory device. Since the tunneling dielectric layer of the present invention is thicker than that of a conventional silicon dioxide layer, the thickness of the tunneling dielectric layer formed according to the present invention is thus sufficient to prevent the penetration of oxygen, dopants and/or electrons through the tunneling dielectric layer into the substrate.

Additionally, since the aforementioned tunneling dielectric layer comprises nitrogen, the tunneling dielectric layer thereby has a denser structure. Beside being able to prevent the penetration of oxygen, dopants or electrons through the tunneling dielectric layer into the substrate, the trapping of oxygen, dopants or electrons in the tunneling dielectric layer is also prevented.

In addition to resolving the aforementioned problems, the application of $(H_yO_xN_y)$ or $(H_fSiON)$ as the tunneling dielectric layer of a read only memory device can also provides the following advantages.

Since the tunneling dielectric layer comprises nitrogen therein, oxidation reaction to generate silicon dioxide at the interface between tunneling dielectric layer and the substrate or the electron trapping layer is prevented.

Further, since a material for forming the tunneling dielectric layer comprises a lower interfacial trap density, oxygen, dopants or electrons will not be trapped at the interface between the tunneling dielectric layer and the electron trapping layer or between the tunneling dielectric layer and the substrate. The stability of the devices threshold voltage can be increased.

Further, the tunneling dielectric layer can maintain a good contact with the polysilicon material at high temperature. Therefore, even after the high thermal annealing process, for example, for the source/drain regions, defect at the interface between the tunneling dielectric layer and the substrate or between the tunneling dielectric layer and the electron trapping layer is prevented. The tunneling dielectric layer of the present invention is thus compatible with the existing manufacturing process.

Since the aforementioned material used for the tunneling dielectric layer can provide a higher current flow, the operating voltage for the programming and the erasing of the read only memory device can be lower.

Further, since the tunneling dielectric layer of the read only memory device can overcome the above problems, the tunneling dielectric layer of the present invention is thus applicable for a further miniaturization of device and an increase of integration of device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 1A to 1E are schematic, cross-sectional views showing the fabrication process for read only memory device that comprises a high-K tunneling dielectric layer according to one aspect of the present invention.

Figure 1A:
FIGS. 1A to 1E are schematic, cross-sectional views showing the fabrication process for read only memory device that comprises a high-K tunneling dielectric layer according to one aspect of the present invention.

Referring to FIG. 1A, a substrate 100 is provided. A high dielectric constant (high-K) tunneling dielectric layer 102 is formed over the substrate 100, wherein the tunneling dielectric layer 102 is formed with hafnium oxynitride ($HfO_xN_y$) or hafnium silicon oxynitride (HfSiON). Further, the dielectric constant of these materials is higher than that of silicon dioxide.

When the tunneling dielectric layer 102 is ($HfO_xN_y$), the tunneling dielectric layer 102 is formed by, for example, a sputtering method. The sputtering method, for example, uses a target formed with hafnium nitride (HfN), followed by forming a solid HfN thin film on the substrate 100 using an inert gas, such as, argon or nitrogen, to bombard the target. Thereafter, a reoxidation process is performed on the substrate 100 having the HfN thin film thereover to transform the HfN thin film into a $HfO_xN_y$ layer (tunneling dielectric layer 102). The reoxidation process is conducted by, for example, delivering a nitrogen gas and an oxygen to serve as an ambient gas and performing an annealing at 400 degrees Celsius to 650 degrees Celsius to form a $HfO_xN_y$ tunneling dielectric layer 102.

When the tunneling dielectric layer 102 is ($HfO_xN_y$), and forming the tunneling dielectric layer 102 is, for example, by chemical vapor deposition (CVD), a precursor gas for the chemical vapor deposition process is, for example, ($C_{16}H_{36}HfO_4$). Moreover, oxygen gas, nitrogen gas and silane gas are used as reaction gases to perform the deposition as 500 degrees Celsius to about 700 degrees Celsius to form the $HfO_xN_y$ tunneling dielectric layer 102 on the substrate 100.

Figure 1B:
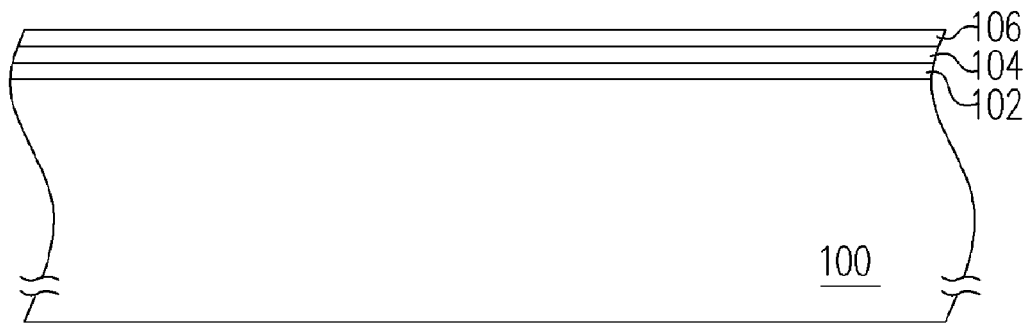

Continuing to FIG. 1B, an electron trapping layer 104 and a top oxide layer 106 are sequentially formed on the tunneling dielectric layer 102, wherein the electron trapping layer 104 is formed with, for example, silicon nitride by a method, such as, chemical vapor deposition. The top oxide layer 106 comprising, for example, silicon oxide, and is formed by oxidizing a portion of the electron trapping layer (silicon nitride layer) 104 with a wet hydrogen/oxygen ($H_2/O_2$) gas.

Figure 1C:
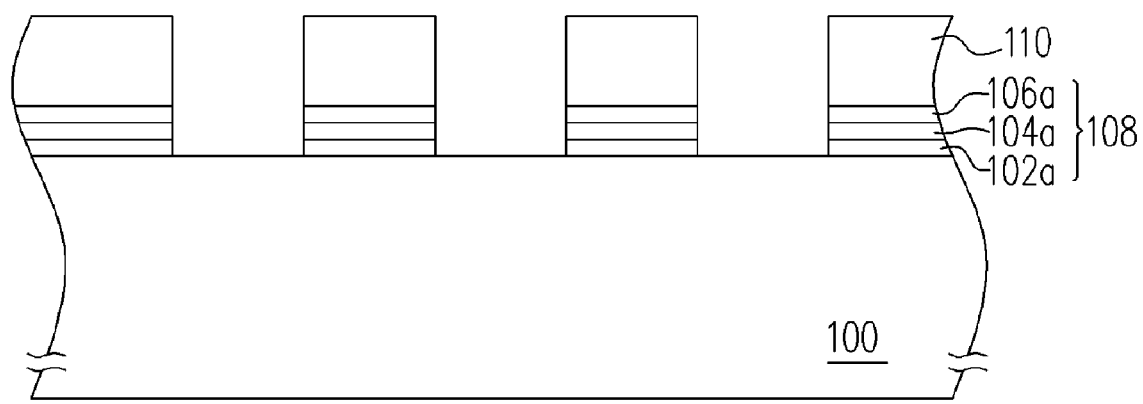

Thereafter, as shown in FIG. 1C, the top oxide layer 106, the electron trapping layer 104 and the tunneling dielectric layer 102 are patterned to form a pluarality of stacked structures 108 of strip shaped top oxide layer 106a, strip shaped electron trapping layer 104a and strip shaped tunneling dielectric layer 102a. The stacked structures 108 are formed by, for example, forming a patterned mask layer 110 over the top oxide layer 106, and using the patterned mask layer 110 as a mask to remove a portion of the top oxide layer 106, the electron trapping layer 104 and the tunneling dielectric layer 102 by anisotropic etching.

Figure 1D:
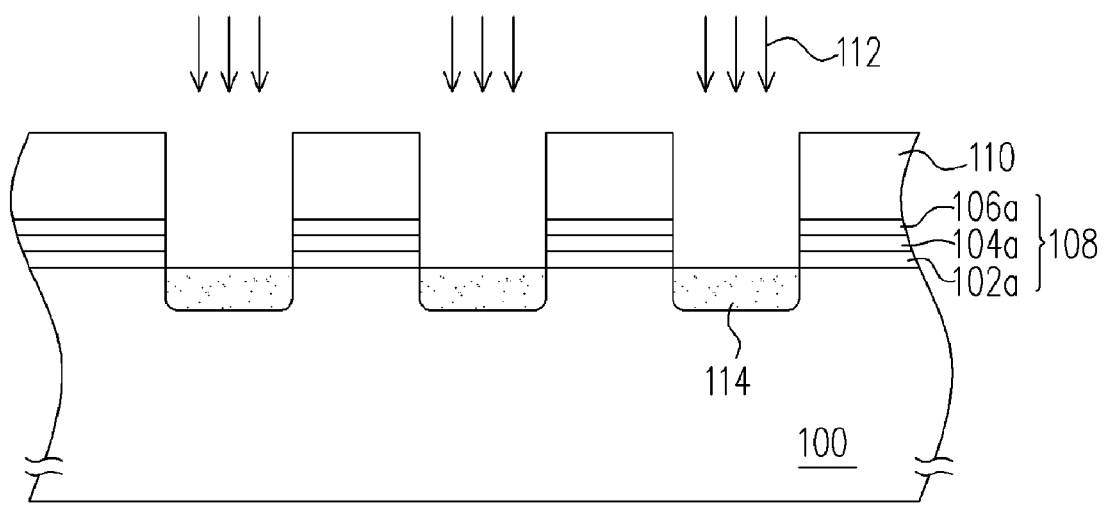

Referring to FIG. 1D, doped regions 114 are formed in the substrate 100 between the stacked structures 108 as the buried drain regions, wherein the doped regions 114 are formed by, for example, using a mask layer 110 as a mask to perform an ion implantation process 112 on the substrate 100. The mask layer 110 over the stacked structures 110 is subsequently removed.

Figure 1E:
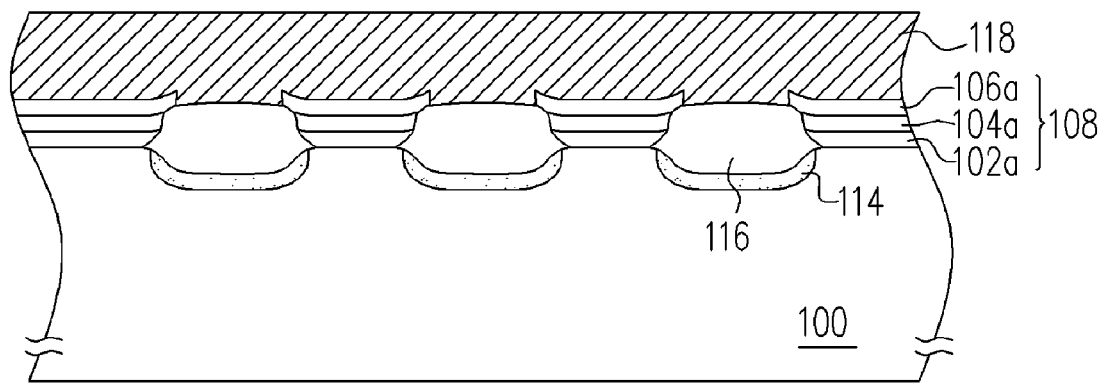

Continuing to FIG. 1E, a buried drain oxide layer 116 is formed over the surface of the doped regions 114, wherein forming the buried drain oxide layer 116 is by, for example, using a wet oxidation method to form an oxide insulation layer on the surface of the doped region 114. A polysilicon conductive layer 118 is formed over the substrate 100 and is further defined as the word line of the read only memory device. The subsequent manufacturing process of the read only memory device is familiar to those skilled in the art and will not be described in detail.

The structure of a read only memory device comprising a high-K tunneling dielectric layer is now described with reference to FIG. 1E. As shown in FIG. 1E, the read only memory device comprising a high-K tunneling dielectric layer comprises at least a substrate 100, a tunneling dielectric layer 102a, an electron trapping layer 104a, a top oxide layer 106a, a conductive layer 118 and a doped region (buried drain region) 114.

The tunneling dielectric layer 102a is disposed over the substrate 100, wherein the tunneling dielectric layer 102a is formed with hafnium oxynitride ($HfO_xN_y$) or hafnium silicon oxynitride (HfSiON).

The electron trapping layer 104a is disposed over the tunneling dielectric layer 102a, wherein the electron trapping layer 104 comprises, for example, silicon nitride.

The top oxide layer 106a is disposed over the electron trapping layer 104a, wherein the top oxide layer 106a comprises silicon oxide. The top oxide layer 106a, the electron trapping layer 104a, the tunneling dielectric layer 102 form the stacked structures 108.

The doped region 114 is configured in the substrate 100 beside both sides of the stacked structures 108. Moreover, at least the conductive layer 118 is disposed over the stacked structures 108, wherein the conductive layer 108 includes polysilicon.

Additionally, the buried drain oxide layer 116 can further be disposed over the doped region to isolate the conductive layer 118 from the doped region 114.

Although the present invention, as described in FIGS. 1A to 1E, has been described with respect to a structure and a fabrication method for a nitride read only memory (NROM), the present invention is applicable also to a read only memory device that comprises a floating gate layer (doped polysilicon).

Further, beside using ($H_fO_xN_y$) or ($H_fSiON$) for the tunneling dielectric layer, other high dielectric constant material, such as $ZrO_2$, $HfO_2$, $ZrO_xN_y$ can also be used for the tunneling dielectric layer.

A high-K tunneling dielectric layer of the present invention provides at least the following advantages.

The dielectric constant of a tunneling dielectric layer formed with ($H_fO_xN_y$) or ($H_fSiON$) is about 12 to 14. The tunneling dielectric layer is thus formed with a thicker equivalent oxide thickness (EOT). In other words, under a same capacitance, the tunneling dielectric layer of the present invention is thicker than a conventional silicon dioxide. The diffusion of oxygen and dopants and a loss of electrons into the substrate are thus prevented.

Since the tunneling dielectric layer formed according to the one aspect of the present invention comprises nitrogen, the tunneling dielectric layer thereby has a denser structure, which can also help to prevent the diffusion of oxygen, dopants or the loss of electrons into the substrate. The trapping of oxygen, dopants or electrons in the tunneling dielectric layer is also avoided.

Since the tunneling dielectric layer comprises nitrogen, oxidation reaction to generate silicon dioxide at the interface between the tunneling dielectric layer and the substrate or between the tunneling dielectric layer and the electron trapping layer is also prevented.

Further, since the tunneling dielectric layer of the present invention comprises a lower interfacial trap density than silicon dioxide, electrons will not be trapped at the interface between the tunneling dielectric layer and the electron trapping layer or between the tunneling dielectric layer and the substrate. The stability of the threshold voltage of the read only memory device can be increased.

Additionally, since the tunneling dielectric layer formed according to the one aspect of the present invention can maintain a good contact with a polysilicon material at high temperature, defect at the interface between the tunneling dielectric layer and the substrate or between the tunneling dielectric layer and the electron trapping layer is prevented. The present invention is thus compatible with the existing manufacturing process.

Since the tunneling dielectric layer of the read only memory device of the present invention can provide a higher current flow, a lower operating voltage for the programming or the erasing operations of the read only memory device can be lower.

Since the read only memory device with a tunneling dielectric layer of the present invention can overcome the diffusion problem of oxygen, dopants and electrons through the tunneling dielectric layer, the read only memory device can be further reduced in dimension to increase the integration of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A read only memory device with a high dielectric constant tunneling dielectric layer, comprising:
   a substrate;
   a tunneling dielectric layer, disposed over the substrate, wherein the tunneling dielectric layer is formed with a material selected from the group consisting of HfSiON and $HfO_xN_y$, wherein the tunneling dielectric layer reduces leakage of electrons stored in the charge trapping layer into the substrate;
   an electron trapping layer, disposed over the tunneling dielectric layer;
   a top dielectric layer, disposed over the electron trapping layer, wherein the tunneling dielectric layer, the electron trapping layer and the top dielectric layer form a stacked structure;
   a conductive layer, disposed at least over the top dielectric layer; and
   a buried diffusion region, configured in the substrate beside bath sides of the stacked structure.

2. The read only memory device with a high dielectric constant tunneling dielectric layer of claim 1, wherein a dielectric constant of the tunneling dielectric layer is greater than a dielectric constant of silicon dioxide.

3. The read only memory device wit a high dielectric constant tunneling dielectric layer of claim 1, wherein a buried drain oxide layer is further disposed over the buried diffusion region beside both sides of the stacked structures.

4. The read only memory device with a high dielectric constant tunneling dielectric layer of claim 1, wherein the electron trapping layer comprises silicon nitride.

5. The read only memory device with a high dielectric constant tunneling dielectric layer of claim 1, wherein the top dielectric layer comprises silicon oxide.

6. A read only memory device with a high dielectric constant tunneling dielectric layer, comprising:
   a substrate;
   an electron trapping layer, disposed over the tunneling dielectric layer;

a tunneling dielectric layer, disposed between the substrate and the electron tapping layer, wherein the tunneling dielectric layer is formed with a material selected from the group consisting of HfSiON, HfO$_x$N$_y$, ZrO$_2$, HfO$_2$ and ZrO$_x$N$_y$, wherein the tunneling dielectric layer reduces leakage of electrons stored in the charge trapping layer into the substrate;

a top dielectric layer, disposed over the electron trapping layer, wherein the tunneling dielectric layer, the electron trapping layer and the dielectric layer form a stacked structure;

a conductive layer, disposed over the top dielectric layer; and a buried diffsion region, configured in the substrate beside both sides of the stacked structure.

7. The read only memory device with a high dielectric constant tunneling dielectric layer of claim 6, wherein a dielectric constant of the tunneling dielectric layer is greater than a dielectric constant of silicon dioxide.

8. The read only memory device with a high dielectric constant tunneling dielectric layer of claim 6, wherein a buried drain oxide layer is further disposed over the buried diffusion region beside both sides of the stacked structures.

9. The read only memory device with a high dielectric constant tunneling dielectric layer of claim 6, wherein the top dielectric layer comprises silicon oxide.

* * * * *